United States Patent [19]
Rosenfeld

[11] Patent Number: 5,922,167
[45] Date of Patent: Jul. 13, 1999

[54] BENDING INTEGRATED CIRCUIT CHIPS

[75] Inventor: Gerald C. Rosenfeld, Amherst, N.Y.

[73] Assignee: Occidential Chemical Corporation, Dallas, Tex.

[21] Appl. No.: 08/784,220

[22] Filed: Jan. 16, 1997

[51] Int. Cl.$^6$ ............................................. C09J 4/00
[52] U.S. Cl. ................... 156/331.5; 29/832; 156/306.9; 524/233; 528/340
[58] Field of Search ............................... 156/331.5, 306.9; 528/340; 524/233; 29/832

[56] References Cited

U.S. PATENT DOCUMENTS

| | | | |
|---|---|---|---|
| 3,242,128 | 3/1966 | Chalmers | 524/233 |
| 3,424,718 | 1/1969 | Angelo | 524/233 |
| 4,315,076 | 2/1982 | Gagliani et al. . | |
| 4,960,846 | 10/1990 | Burgess et al. . | |
| 5,298,331 | 3/1994 | Kanakarajan et al. . | |
| 5,635,010 | 6/1997 | Pepe et al. | 156/299 |

FOREIGN PATENT DOCUMENTS

| | | |
|---|---|---|
| 0522649A1 | 1/1993 | European Pat. Off. . |
| 0618614 | 10/1994 | European Pat. Off. . |

OTHER PUBLICATIONS

Condensed Chemical Dictionary (CCD), p. 857, ©1977.
John A. Kreuz et. al., in *Macromolecules* (vol. 28, No. 20) Crystalline Homopolyimides and titled Copolyimides etc. (1995).

*Primary Examiner*—John J. Gallagher
*Attorney, Agent, or Firm*—Richard D. Fuerle; Anne E. Brookes

[57] ABSTRACT

Disclosed is a method of bonding integrated circuit chips to lead frames where the leads are later soldered. A solution of an adhesive polyimide is used. The polyimide is the reaction product of an aromatic dianhydride and a mixture of an aromatic diamine and an aliphatic diamine.

20 Claims, No Drawings

BENDING INTEGRATED CIRCUIT CHIPS

This application is a continuation of application Ser. No. 08/784,220, filed Jan. 16, 1997, now abandoned.

BACKGROUND OF THE INVENTION

This invention relates to a polyimide adhesive that is useful in bonding integrated circuit chips to a lead frame, where the leads are subsequently soldered. In particular, it relates to a solution of a polyimide made from a dianhydride and a mixture consisting essentially of an aromatic diamine and an aliphatic diamine.

In manufacturing microelectronic components, integrated circuit chips are bonded to lead frames using a polyimide resin. Later, the leads from the chips are soldered to the leads from the lead frames. A persistent problem in the industry has been the failure of the solder to "wet" the leads and form a good electrical connection.

SUMMARY OF THE INVENTION

I have discovered that the failure of solder to "wet" leads is due to the use of polyimide adhesive resins that contain siloxane groups. I have found that when these resins are heated, they evolve silicon-containing compounds that condense on the leads, preventing the solder from wetting the leads. I have further found that a polyimide adhesive made from a dianhydride and a mixture of aromatic and aliphatic diamines is an excellent adhesive for this application and will not prevent the solder from wetting the leads because it evolves almost no volatiles during bonding.

Surprisingly, I have also found that the peel strength after pressure cooking of the adhesives of this invention is better than for identical adhesives made with a siloxane-containing diamine instead of an aliphatic diamine.

DESCRIPTION OF THE PREFERRED EMBODIMENTS

The adhesives of this invention are prepared by reacting in an organic solvent an aromatic dianhydride with a mixture of aromatic and aliphatic diamines.

Organic Solvent

The organic solvent should be a low boiling solvent so that the adhesive can be dried at moderate temperatures; a boiling point of less than 180° C. is preferred. Suitable organic solvents include N-methylpyrrolidone (NMP), dimethylacetamide (DMAC), 2-vinyl pyrrolidone, acetone, benzene, toluene, xylene, "Cellosolve" (glycol ethyl ether), "Cellosolve acetate" (hydroxyethyl acetate glycol monoacetate), diethyl ether, dichloromethane, dimethyl formamide (DMF), ethyl alcohol, methyl isobutyl ketone, methyl ethyl ketone, sulfolane, dimethyl sulfoxide (DMSO), hexamethylphosphoramide (HMPA), tetramethyl urea (TMU), diethyleneglycol diethyl ether, 1,2-dimethoxyethane (monoglyme), diethylene glycol dimethyl ether (diglyme), 1,2-bis(2-methoxyethoxy) ethane (triglyme), bis [2-(2-methoxyethoxy) ethyl)] ether (tetraglyme), bis(2-methoxyethyl) ether tetrahydrofuran, m-dioxane, and p-dioxane. NMP and DMAC are preferred as they are good solvents for polyamic acids. About 5 to about 50 wt % (based on total solvent weight) of a cosolvent, such as toluene or xylene, may be useful with NMP, DMAC, or other solvents to aid in water removal.

Aromatic Dianhydride

Any aromatic dianhydride or combination of aromatic dianhydrides can be used as the dianhydride monomer in forming the polyimide. Examples of suitable aromatic dianhydrides include:

1,2,5,6-naphthalene tetracarboxylic dianhydride;
1,4,5,8-naphthalene tetracarboxylic dianhdyride;
2,3,6,7-naphthalene tetracarboxylic dianhydride;
2-(3',4'-dicarboxyphenyl) 5,6-dicarboxybenzimidazole dianhydride;
2-(3',4'-dicarboxyphenyl) 5,6-dicarboxybenzoxazole dianhydride;
2-(3',4'-dicarboxyphenyl) 5,6-dicarboxybenzothiazole dianhydride;
2,2',3,3'-benzophenone tetracarboxylic dianhydride;
2,3,3',4'-benzophenone tetracarboxylic dianhydride;
3,3',4,4'-benzophenone tetracarboxylic dianhydride (BTDA);
2,2',3,3'-biphenyl tetracarboxylic dianhydride;
2,3,3',4'-biphenyl tetracarboxylic dianhydride;
3,3',4,4'-biphenyl tetracarboxylic dianhydride (BPDA);
bicyclo-[2,2,2]-octen-(7)-2,3,5,6-tetracarboxylic-2,3,5,6-dianhydride;
thio-diphthalic anhydride;
bis (3,4-dicarboxyphenyl) sulfone dianhydride;
bis (3,4-dicarboxyphenyl) sulfoxide dianhydride;
bis (3,4-dicarboxyphenyl oxadiazole-1,3,4) paraphenylene dianhydride;
bis (3,4-dicarboxyphenyl) 2,5-oxadiazole 1,3,4-dianhydride;
bis 2,5-(3',4'-dicarboxydiphenylether) 1,3,4-oxadiazole dianhydride;
bis (3,4-dicarboxyphenyl) ether dianhydride or 4,4'-oxydiphthalic anhydride (ODPA);
bis (3,4-dicarboxyphenyl) thioether dianhydride;
bisphenol A dianhydride (BPADA);
bisphenol S dianhydride;
2,2-bis (3,4-dicarboxyphenyl) hexafluoropropane dianhydride or 5,5-[2,2,2-trifluoro-1-(trifluoromethyl) ethylidene] bis-1,3-isobenzofurandione) (6FDA);
hydroquinone bisether dianhydride;
bis (3,4-dicarboxyphenyl) methane dianhydride;
cyclopentadienyl tetracarboxylic acid dianhydride;
cyclopentane tetracarboxylic dianhydride;
ethylene tetracarboxylic acid dianhdyride;
perylene 3,4,9,10-tetracarboxylic dianhydride;
pyromellitic dianhydride (PMDA);
tetrahydrofuran tetracarboxylic dianhydride; and
resorcinol dianhydride.

The preferred dianhydrides and BTDA, BPDA, ODPA, and 6FDA, as they are readily available and have been found to give superior properties. The dianhydrides can be used in their tetraacid form or as mono, di, tri, or tetra esters of the tetra acid, but the dianhydride form is preferred because it is more reactive.

Aromatic Diamine

To prevent the polyimide from being too soft, about 50 to about 95 mole % of the diamine content of the polyimide should be a non-siloxane containing aromatic diamine; preferably, about 75 to about 90 mole % of the diamine content is non-siloxane containing aromatic diamine. Examples of suitable aromatic diamines include:

m-phenylenediamine;

p-phenylenediamine (PDA);

2,5-dimethyl-1,4-diaminobenzene or 2,5-dimethyl-1,4-phenylenediamine (DPX);

2,4-diaminotoluene (TDA);

2,5- and 2,6-diaminotoluene;

p- and m-xylenediamine;

4,4'-diaminobiphenyl;

4,4'-diaminodiphenyl ether or 4,4'-oxydianiline (ODA);

4, 4'-diaminobenzophenone;

3,3',3,4', or 4,4'-diaminophenyl sulfone or m,m-, m,p- or p,p-sulfone dianiline;

4,4'-diaminodiphenyl sulfide;

3,3' or 4,4'-diaminodiphenylmethane or m,m- or p,p-methylene dianiline;

3,3'-dimethylbenzidine;

α,α'-bis(4-aminophenyl)-1,4-diisopropyl benzene or 4,4'-isopropylidenedianiline or bisaniline p;

α,α'-bis(4-aminophenyl)-1,3-diisopropyl benzene or 3,3'-isopropylidonedianiline or bisaniline m;

1,4-bis(p-aminophenoxy)benzene;

1,3-bis(p-aminophenoxy)benzene;

4,4'-bis (4-aminophenoxy)biphenyl;

1,3-bis(3-aminophenoxy)benzene (APB);

2,4-diamine-5-chlorotoluene;

2,4-diamine-6-chlorotoluene;

2,2-bis(4[4-aminophenoxy]phenyl)propane (BAPP);

trifluoromethyl-2,4-diaminobenzene;

trifluoromethyl-3,5-diaminobenzene;

2,2'-bis(4-aminophenyl)-hexafluoropropane (6F diamine);

2,2'-bis(4-phenoxy aniline) isopropylidene;

2,4,6-trimethyl-1,3-diaminobenzene;

4,4'-diamino-2,2'-trifluoromethyl diphenyloxide;

3,3'-diamino-5,5'-trifluoromethyl diphenyloxide;

4,4'-trifluoromethyl-2,2'-diaminobiphenyl;

2,4,6-trimethyl-1,3-diaminobenzene; diaminoanthraquinone;

4,4'-oxybis[2-trifluoromethyl)benzeneamine] (1,2,4-OBABTF);

4,4'-oxybis[3-trifluoromethyl)benzeneamine];

4,4'-thiobis[(2-trifluoromethyl)benzeneamine];

4,4'-thiobis[(3-trifluoromethyl)benzeneamine];

4,4'-sulfoxylbis[(2-trifluoromethyl)benzeneamine];

4,4'-sulfoxylbis[(3-trifluoromethyl)benzeneamine];

4,4'-ketobis[(2-trifluoromethyl)benzeneamine];

4,4'-[(2,2,2-trifluoromethyl-1-(trifluoromethyl)-ethylidine)bis(3-trifluoromethyl)benzeneamine].

The preferred aromatic diamines are APB, BAPP, DPX, and bisaniline P, or a combination of these, due to their excellent properties.

Aliphatic Diamines

About 5 to about 50 mole % of the diamine monomer, and preferably about 10 to about 25 mole %, is an aliphatic diamine that does not contain siloxane groups. If less aliphatic diamine is used, the polyimide becomes less soluble, has less adhesion, and is more difficult to process, and more aliphatic diamine will lower the Tg. The aliphatic diamines useful in this invention preferably have the formula $H_2N-R-NH_2$, where R is hydrocarbon from $C_2$ to $C_{20}$; preferably, R is a straight chain hydrocarbon from $C_6$ to $C_{12}$ as those diamines are more readily available. Also, the aliphatic diamine preferably is an α, ω-diamine because they are more reactive. Examples of suitable aliphatic diamines include:

hexamethylenediamine or 1,6-hexanediamine (HD);

heptamethylene diamine;

monomethylenediamine;

decamethylenediamine;

1,12-dodecamethylenediamine (DDD);

2-methyl-1,5-pentanediamine (MDP);

1,4-cyclohexanediamine; and bis(4-aminocyclohexyl) methane.

The preferred aliphatic diamine is DDD because it has been found to work well.

Preparation of Polyimide

Generally, stoichiometric quantities of diamine and dianhydride monomers are used to obtain polyimides of the highest molecular weight, but the equivalent ratio of dianhydride to diamine can range from 1:2 to 2:1. The solution of the monomers in the solvent is preferably about 5 to about 20 wt % solids, where "solids" means components other than the solvent.

Upon the addition of the monomers to the solvent, polymerization will occur at room temperature to form a polyamic acid. The polyamic acid is then imidized. This can be accomplished chemically by, for example, the addition of acetic anhydride, or by heating, preferably at about 130 to about 200° C. (The polyimide is preferably fully imidized.)

The solution of the polyimide is spread on a non-adhering surface, such as glass coated with a release agent, and heated at 250° C. to remove solvent. The resulting film is peeled from the surface and is positioned between surfaces to be bonded. (Bonding can also be done by applying the solution to a surface, drying by evaporating the solvent, and covering the polyimide with a second surface.) Also, a paste of 30 to 70 wt % polyimide in an organic solvent, which also contains about 1 to about 10 wt % of a thixotrope, such as silica, can be screen printed onto one of the articles to be bonded. Bonding can be achieved by heating at about 250 to about 450° C. for less than a second.

The following examples further illustrate this invention.

EXAMPLE 1

Various polyamic acids were prepared in a solvent mixture of 85 wt % NMP-15 wt % toluene by adding monomers at 17 wt % solids to the solvent mixture and letting the resulting solution stand at room temperature for 16 hours. (This was followed by imidization at 165 to 175° C. for 2 to 4 hours.) Formulations 1 to 4 and 6 to 9 are comparative examples ("C") as they contain siloxane diamines. The siloxane diamines have the formula:

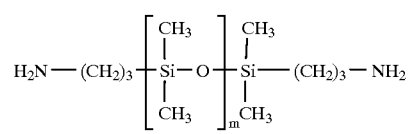

and are designated "$G_m$". The following table gives the formulations prepared and their Tg as determined by dynamic mechanical thermal analysis (DMTA):

| Formulation | Aromatic Dianhydride (m) | | Aromatic Diamine (m) | | Aliphatic Diamine (m) | | Siloxane Diamine (m) | | Tg (°C.) |
|---|---|---|---|---|---|---|---|---|---|
| 1C | BPDA | (0.0215) | BAPP | (0.0205) | | | $G_9$ | (0.0031) | 239 |
|  | BTDA | (0.0092) | DPX | (0.0063) | | | $G_1$ | (0.0016) | |
| 2C | BPDA | (0.1031) | BAPP | (0.0949) | DDD | (0.0092) | $G_1$ | (0.0072) | 247 |
|  | BTDA | (0.0427) | DPX | (0.0292) | | | $G_{25}$ | (0.0053) | |
| 3C | BPDA | (0.1031) | BAPP | (0.0949) | DDD | (0.0161) | $G_{25}$ | (0.0055) | 247 |
|  | BTDA | (0.0427) | DPX | (0.0292) | | | | | |
| 4C | BPDA | (0.1031) | BAPP | (0.0949) | | | $G_1$ | (0.00167) | 244 |
|  | BTDA | (0.0427) | DPX | (0.0292) | | | $G_{25}$ | (0.0050) | |
| 5 | BPDA | (0.1031) | BAPP | (0.0949) | DDD | (0.0217) | | | 242 |
|  | BTDA | (0.0427) | DPX | (0.0292) | | | | | |
| 6C | ODPA | (0.1758) | APB | (0.1023) | DDD | (0.0210) | $G_{25}$ | (0.0118) | 163 |
| 7C | ODPA | (0.1365) | APB | (0.1122) | | | $G_{25}$ | (0.0143) | 176 |
| 8C | ODPA | (0.1357) | APB | (0.1025) | | | $G_1$ | (0.0217) | 157 |
|  | | | | | | | $G_{25}$ | (0.0115) | |
| 9C | ODPA | (0.0333) | APB | (0.0250) | | | $G_9$ | (0.0083) | 148 |
| 10 | ODPA | (0.1727) | APB | (0.1296) | DDD | (0.0431) | | | 162 |
| 11 | ODPA | (0.1727) | APB | (0.1345) | MPD | (0.0447) | | | 187 |
| 12 | ODPA | (0.1727) | APB | (0.1345) | HD | (0.0447) | | | 182 |

The formulations were tested for peel strength as bonded and after one and two days at 121° C. and 100% relative humidity (RH) (pressure cooker test). The bond was for 60 seconds at 3.4 MPa (500 psi) to Alloy 42 (an alloy of 42 wt % nickel and 58 wt % iron). Samples of formulations were placed in a thermal desorber-gas chromatograph. The samples were heated to 400° C. for about 5 minutes and the wt % of siloxane-containing volatiles emitted was determined. The following table gives the results:

| Formulation | Bond Temp. (°C.) | PEEL STRENGTH (kg/cm) | | | Wt % Siloxane Volatiles (ppm)* |
|---|---|---|---|---|---|
| | | Initial | After 1 day 121° C./ 100% RH | After 2 days 121° C./ 100% RH | |
| 1C | 275 | 1.20 | 1.47 | 0.99 | 2500 |
| 2C | 275 | 0.93 | 0.77 | 0.71 | 2060 |
| 3C | 275 | 0.94 | 0.78 | 0.72 | 1990 |
| 4C | 275 | 1.06 | 0.81 | 0.67 | 2500 |
| 5  | 275 | 1.73 | 1.80 | 1.67 | 0 |
| 6C | 250 | 1.49 | 0    | 0    | 4200 |
| 7C | 250 | 0.64 | 0    | 0    | 4910 |
| 8C | 250 | 1.39 | 0    | 0    | 4660 |
| 9C | 250 | 1.84 | 0.16 | 0    | 5000 |
| 10 | 225 | 1.89 | 0.90 | 1.46 | 0 |
| 11 | 250 | 1.80 | 1.87 | 1.70 | 0 |
| 12 | 250 | 1.97 | 1.96 | 1.70 | 0 |

*based on wt of polymer
C = comparative example

The above table shows that the best retention of peel strength was in the formulations of this invention, formulations 5, 10, 11, and 12.

We claim:

1. An improved method of bonding an integrated circuit chip to a lead frame without adversely affecting soldering of the leads of said chip to said frame comprising
   (A) preparing a first solution in an organic solvent of a polyamic acid which comprises the reaction product of
      (1) an aromatic dianhydride; and
      (2) diamine which consists essentially of a mixture of
         (a) about 50 to about 95 mole % aromatic diamine; and
         (b) about 5 to about 50 mole % wholly aliphatic diamine, where said polyimide adhesive is free of siloxane linkages;
   (B) fully imidizing said polyamic acid in said solution to form a second solution of a fully imidized polyimide;
   (C) in either order,
      (1) removing said solvent; and
      (2) placing said fully imidized polyimide between said integrated circuit chip and said lead frame;
   (D) pressing said integrated circuit chip against said lead frame; and
   (E) heating said fully imidized polyimide to form a bond between said integrated circuit chip and said lead frame.

2. A method according to claim 1 wherein said solvent is removed before said fully imidized polyimide is placed between said integrated circuit chip and said lead frame.

3. A method according to claim 2 wherein said second solution is spread onto a non-adhering surface and is heated to remove said solvent, thereby forming a film on said non-adhering surface.

4. A method according to claim 1 wherein said solvent is removed after said fully imidized polyimide is placed between said integrated circuit chip and said lead frame.

5. A method according to claim 1 wherein a paste is made of 30 to 70 wt % of said polyimide in said solvent, including about 1 to about 10 wt % of a thixotrope.

6. A method according to claim 5 wherein said paste is screen-printed onto said lead frame.

7. A method according to claim 1 wherein said aromatic dianhydride is selected from the group consisting of 3,3',4,4'-benzophenone tetracarboxylic dianhydride, 3,3',4,4'-biphenyl tetracarboxylic dianhydride, oxydiphthalic dianhydride, and 5,5-[2,2,2-trifluoro-1-(trifluoromethyl) ethylidene]bis-1,3-isobenzofurandione.

8. A method according to claim 1 wherein said aromatic diamine is selected from the group consisting of 1,3-bis(3-aminophenoxy) benzene, 2,2-bis(4[4-aminophenoxy] phenyl) propane, 2,5-dimethyl-1,4-diaminobenzene, and bisaniline P.

9. A method according to claim 1 wherein said aliphatic diamine has the general formula $H_2N-R-NH_2$, where R is hydrocarbon from $C_2$ to $C_{20}$.

10. A method according to claim 9 wherein said aliphatic diamine is an α,ω-diamine.

11. A method according to claim 10 wherein said α,ω-diamine is 1,12-dodecadiamine.

12. A method according to claim 1 wherein said solvent is selected from the group consisting of N-methyl pyrrolidone.

13. An article made according to the method of claim 1.

14. An improved method of mounting an integrated circuit chip onto a lead frame without adversely affecting soldering of the leads of said chip to said frame comprising (A) preparing a first solution of about 5 to about 20 wt % solids in an organic solvent of a polyamic acid, where said polyamic acid comprises the reaction product of
  (1) an aromatic dianhydride selected from 3,3',4,4'-benzophenone tetracarboxylic dianhydride, 3,3',4,4'-biphenyl tetracarboxylic dianhydride, oxydiphthalic dianhydride, and 5,5-[2,2,2-trifluoro-1-(trifluoromethyl)ethylidene]bis-1,3-isobenzofurandione; and
  (2) diamine in a mole ratio of 1:2 to 2:1 with said aromatic dianhydride, said diamine consisting essentially of a mixture of
    (a) about 75 to about 85 mole % aromatic diamine selected from 1,3-bis(3-aminophenoxy) benzene, 2,2-bis(4[4-aminophenoxy]phenyl) propane, 2,5-dimethyl-1,4-diaminobenzene, and bisaniline P; and
    (b) about 15 to about 25 mole % wholly aliphatic diamine, where said polyamic acid is free of siloxane linkages;
(B) heating said first solution at about 130 to about 200° C. to fully imidize said polyamic acid and form a second solution of a fully imidized polyimide;
(C) preparing a paste which comprises about 30 to about 70 wt % of said polyimide in said solvent and about 1 to about 10 wt % of a thixotrope;
(D) screen printing said paste onto said lead frame;
(E) evaporating said solvent;
(F) pressing said integrated circuit chip against said paste on said lead frame; and
(G) heating said paste at about 250 to about 450° C. for less than a second to bond said integrated circuit chip to said lead frame.

15. A method according to claim 14 wherein said aliphatic diamine is 1,12-dodecadiamine.

16. An article made according to the method of claim 14.

17. A method according to claim 14 wherein said solvent is N-methyl pyrrolidone.

18. An article made according to the method of claim 17.

19. An improved method of bonding an integrated circuit chip to a lead frame without adversely affecting soldering of the leads of said chip to said lead frame comprising (A) preparing a first solution of about 5 to about 20 wt % solids in an organic solvent of a polyamic acid where said polyamic acid comprises the reaction product of
  (1) an aromatic dianhydride selected from 3,3',4,4'-benzophenone tetracarboxylic dianhydride, 3,3',4,4'-biphenyl tetracarboxylic dianhydride, oxydiphthalic dianhydride, and 5,5-[2,2,2-trifluoro-1-(trifluoromethyl)ethylidene]bis-1,3-isobenzofurandione; and
  (2) diamine in a mole ratio of 1:2 to 2:1 with said aromatic dianhydride, said diamine consisting essentially of a mixture of
    (a) about 75 to about 85 mole % aromatic diamine selected from 1,3-bis(3-aminophenoxy) benzene, 2,2bis(4[4-aminophenoxy]phenyl) propane, 2,5-dimethyl-1,4-diaminobenzene, and bisaniline P; and
    (b) about 15 to about 25 mole % aliphatic diamine; where said polyamic acid is free of siloxane linkages;
(B) heating said first solution at about 130 to about 200° C. to fully imidize said polyamic acid and form a second solution of a fully imidized polyimide;
(C) spreading said second solution onto a non-adhering surface;
(D) heating said second solution to remove said solvent and form a film;
(E) placing said film between said integrated circuit chip and said lead frame;
(F) pressing said integrated circuit chip against said lead frame; and
(G) heating said film at about 250 to about 450° C. for less than one second to bond said integrated circuit chip to said lead frame.

20. A method according to claim 19 wherein said solvent is N-methyl pyrrolidone.

* * * * *